(12) United States Patent
Bushnell et al.

(10) Patent No.: US 10,295,562 B1
(45) Date of Patent: *May 21, 2019

(54) ELECTRONIC WATCH WITH OBSCURED SENSOR FOR DETECTING AN APPLIED FORCE

(71) Applicant: Apple Inc., Cupertino, CA (US)

(72) Inventors: Tyler S. Bushnell, Mountain View, CA (US); Vikram Garg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,226

(22) Filed: Jun. 25, 2018

Related U.S. Application Data

(63) Continuation of application No. 14/641,150, filed on Mar. 6, 2015, now Pat. No. 10,006,937.

(51) Int. Cl.
*G01D 7/00* (2006.01)
*G01R 1/04* (2006.01)
(Continued)

(52) U.S. Cl.
CPC ............... *G01R 1/04* (2013.01); *G06F 3/044* (2013.01); *G06F 2203/04102* (2013.01);
(Continued)

(58) Field of Classification Search
CPC . G01R 1/04; G06F 3/044; G06F 2203/04102; G06F 2203/04103;
(Continued)

(56) References Cited

U.S. PATENT DOCUMENTS 4,527,862 A 7/1985 Arakawa
5,343,064 A 8/1994 Spangler et al.
(Continued)

FOREIGN PATENT DOCUMENTS

CN 1502166 6/2004
CN 1577385 2/2005
(Continued)

OTHER PUBLICATIONS

Bau, et al., "TeslaTouch: Electrovibration for Touch Surfaces," UIST'10, Oct. 3-6, 2010, New York, New York USA, 10 pages.
(Continued)

*Primary Examiner* — Lisa M Caputo
*Assistant Examiner* — Nigel H Plumb
(74) *Attorney, Agent, or Firm* — Brownstein Hyatt Farber Schreck, LLP

(57) ABSTRACT

An electronic watch is described. The watch has one or more sensors, including a sensor that may be used to detect a force applied to a cover of the watch. The sensor may variously include a capacitive sensor assembly configured to detect a deflected position of the cover; a sensor having electrical components that move toward one another in response to an input applied to the cover; or a deformable component that is configured to compress in response to a press input, thereby allowing first and second electrical traces to move toward one another. Portions or all of the various sensors may be obscured by an ink layer on an underside of the cover.

20 Claims, 16 Drawing Sheets

(51) Int. Cl.
*G06F 3/044* (2006.01)
*H05K 3/10* (2006.01)
*H05K 3/00* (2006.01)

(52) U.S. Cl.
CPC .. *G06F 2203/04103* (2013.01); *H05K 3/0014* (2013.01); *H05K 3/103* (2013.01); *H05K 3/105* (2013.01); *H05K 2201/0133* (2013.01); *H05K 2201/0162* (2013.01); *H05K 2201/10151* (2013.01)

(58) Field of Classification Search
CPC ............. H05K 3/0014; H05K 3/105; H05K 2201/0133; H05K 2201/0162; H05K 2201/10151
See application file for complete search history.

(56) References Cited

U.S. PATENT DOCUMENTS

| | | |
|---|---|---|
| 5,929,517 A | 7/1999 | Distefano et al. |
| 6,002,389 A | 12/1999 | Kasser |
| 6,079,282 A | 6/2000 | Lanter |
| 6,154,580 A | 11/2000 | Kuriyama et al. |
| 6,323,846 B1 | 11/2001 | Westerman et al. |
| 6,545,495 B2 | 4/2003 | Warmack et al. |
| 6,568,275 B2 | 5/2003 | Scholz et al. |
| 6,570,557 B1 | 5/2003 | Westerman et al. |
| 6,570,707 B1 | 5/2003 | Murakami |
| 6,676,611 B1 | 1/2004 | Bromba |
| 6,677,932 B1 | 1/2004 | Westerman |
| 6,989,728 B2 | 1/2006 | Van Zeeland et al. |
| 7,158,122 B2 | 1/2007 | Roberts |
| 7,211,885 B2 | 5/2007 | Nordal et al. |
| 7,337,085 B2 | 2/2008 | Soss |
| 7,409,876 B2 | 8/2008 | Ganapathi et al. |
| 7,511,702 B2 | 3/2009 | Hotelling |
| 7,538,760 B2 | 5/2009 | Hotelling et al. |
| 7,609,178 B2 | 10/2009 | Son et al. |
| 7,784,366 B2 | 8/2010 | Daverman et al. |
| 7,800,592 B2 | 9/2010 | Kerr et al. |
| 7,946,758 B2 * | 5/2011 | Mooring .............. G04B 37/005 368/276 |
| 8,072,437 B2 | 12/2011 | Miller et al. |
| 8,111,248 B2 | 2/2012 | Lee et al. |
| 8,169,332 B2 | 5/2012 | Son |
| 8,169,416 B2 | 5/2012 | Han |
| 8,228,306 B2 | 7/2012 | Long |
| 8,253,711 B2 | 8/2012 | Kim et al. |
| 8,274,495 B2 | 9/2012 | Lee |
| 8,289,290 B2 | 10/2012 | Klinghult |
| 8,334,849 B2 | 12/2012 | Murphy et al. |
| 8,351,993 B2 | 1/2013 | Nunes |
| 8,390,481 B2 | 3/2013 | Pance et al. |
| 8,421,978 B2 | 4/2013 | Wang et al. |
| 8,436,823 B2 | 5/2013 | Kanehira et al. |
| 8,525,797 B2 | 9/2013 | Liu et al. |
| 8,547,350 B2 | 10/2013 | Anglin et al. |
| 8,577,289 B2 | 11/2013 | Schlub et al. |
| 8,577,644 B1 | 11/2013 | Ksondzyk et al. |
| 8,633,916 B2 | 1/2014 | Bernstein et al. |
| 8,638,316 B2 | 1/2014 | Badaye et al. |
| 8,669,963 B2 | 3/2014 | Baker et al. |
| 8,704,787 B2 | 4/2014 | Yamamoto et al. |
| 8,711,122 B2 | 4/2014 | Wada et al. |
| 8,724,861 B1 | 5/2014 | Sun |
| 8,743,083 B2 | 6/2014 | Zanone et al. |
| 8,760,413 B2 | 6/2014 | Peterson et al. |
| 8,780,055 B2 | 7/2014 | Marchand et al. |
| 8,780,062 B2 | 7/2014 | Hibara et al. |
| 8,780,075 B2 | 7/2014 | Yamano et al. |
| 8,810,521 B2 | 8/2014 | Ito |
| 8,830,205 B2 | 9/2014 | Chang et al. |
| 8,913,031 B2 | 12/2014 | Honda et al. |
| 8,922,523 B2 | 12/2014 | Lynch et al. |
| 8,963,874 B2 * | 2/2015 | Li ..................... G06F 3/0414 345/174 |
| 8,988,364 B2 | 3/2015 | Lee |
| 9,001,080 B2 | 4/2015 | Okayama et al. |
| 9,024,907 B2 | 5/2015 | Bolender |
| 9,030,440 B2 | 5/2015 | Pope et al. |
| 9,057,653 B2 | 6/2015 | Schediwy et al. |
| 9,086,768 B2 | 7/2015 | Elias et al. |
| 9,088,282 B2 | 7/2015 | Holenarsipur et al. |
| 9,092,129 B2 | 7/2015 | Abdo et al. |
| 9,104,898 B2 | 8/2015 | Case |
| 9,116,569 B2 | 8/2015 | Stacy et al. |
| 9,207,134 B2 | 12/2015 | Ting et al. |
| 9,218,472 B2 | 12/2015 | Alameh et al. |
| 9,229,587 B2 | 1/2016 | Kawaguchi et al. |
| 9,235,645 B1 | 1/2016 | Ishizone et al. |
| 9,262,002 B2 | 2/2016 | Momeyer et al. |
| 9,323,372 B2 | 4/2016 | Kim et al. |
| 9,354,752 B2 | 5/2016 | Kanehira et al. |
| 9,375,874 B2 | 6/2016 | Lin et al. |
| 9,390,308 B2 | 7/2016 | Mankowski et al. |
| 9,411,457 B2 | 8/2016 | Perlin et al. |
| 9,411,458 B2 | 8/2016 | Worfolk et al. |
| 9,430,102 B2 | 8/2016 | Prest et al. |
| 9,454,268 B2 | 9/2016 | Badaye et al. |
| 9,459,738 B2 | 10/2016 | Lin et al. |
| 9,477,342 B2 | 10/2016 | Daverman et al. |
| 9,490,804 B2 | 11/2016 | Hanumanthaiah et al. |
| 9,494,473 B2 | 11/2016 | Hanson et al. |
| 9,535,518 B2 | 1/2017 | Kang et al. |
| 9,541,578 B2 | 1/2017 | Shimata et al. |
| 9,542,589 B2 | 1/2017 | Thammasouk et al. |
| 9,671,889 B1 | 6/2017 | Miller et al. |
| 9,678,586 B2 | 6/2017 | Reynolds |
| 9,697,409 B2 | 7/2017 | Myers |
| 9,710,095 B2 | 7/2017 | Hotelling |
| 9,715,290 B2 | 7/2017 | Kim et al. |
| 9,715,301 B2 | 7/2017 | Kuboyama et al. |
| 9,772,245 B2 | 9/2017 | Besling et al. |
| 9,851,828 B2 | 12/2017 | Richards et al. |
| 9,910,529 B2 | 3/2018 | Chang et al. |
| 10,006,937 B2 * | 6/2018 | Bushnell .................. G01R 1/04 |
| 2005/0005703 A1 | 1/2005 | Saito et al. |
| 2006/0197753 A1 | 9/2006 | Hotelling |
| 2007/0272919 A1 | 11/2007 | Mori et al. |
| 2008/0150901 A1 | 6/2008 | Lowles et al. |
| 2009/0015564 A1 | 1/2009 | Ye et al. |
| 2009/0066345 A1 | 3/2009 | Klauk et al. |
| 2009/0237374 A1 | 9/2009 | Li et al. |
| 2010/0045628 A1 | 2/2010 | Gettemy et al. |
| 2010/0117989 A1 | 5/2010 | Chang |
| 2010/0123686 A1 | 5/2010 | Klinghult et al. |
| 2010/0220065 A1 | 9/2010 | Ma |
| 2011/0012845 A1 | 1/2011 | Rothkopf et al. |
| 2011/0037706 A1 | 2/2011 | Pasquero et al. |
| 2011/0080373 A1 | 4/2011 | Wang et al. |
| 2011/0096013 A1 | 4/2011 | Krumpelman et al. |
| 2011/0216016 A1 | 9/2011 | Rosener |
| 2011/0227872 A1 | 9/2011 | Huska et al. |
| 2011/0235156 A1 | 9/2011 | Kothari et al. |
| 2012/0038577 A1 | 2/2012 | Brown et al. |
| 2012/0056826 A1 | 3/2012 | Kim et al. |
| 2012/0090757 A1 | 4/2012 | Buchan et al. |
| 2012/0092285 A1 * | 4/2012 | Osborn ................ G06F 3/044 345/174 |
| 2012/0098760 A1 | 4/2012 | Chuang |
| 2012/0098767 A1 | 4/2012 | Takai et al. |
| 2012/0104097 A1 | 5/2012 | Moran et al. |
| 2012/0169612 A1 | 7/2012 | Alameh et al. |
| 2012/0188202 A1 | 7/2012 | Tsujino et al. |
| 2012/0274602 A1 | 11/2012 | Bita et al. |
| 2012/0313863 A1 | 12/2012 | Hsu |
| 2012/0319987 A1 | 12/2012 | Woo |
| 2013/0128416 A1 | 5/2013 | Weber |
| 2013/0176270 A1 | 7/2013 | Cattivelli et al. |
| 2013/0234977 A1 * | 9/2013 | Lin ..................... G06F 3/044 345/174 |
| 2013/0328575 A1 | 12/2013 | Ra et al. |
| 2014/0085213 A1 | 3/2014 | Huppi et al. |

(56) References Cited

U.S. PATENT DOCUMENTS

| | | | |
|---|---|---|---|
| 2014/0085247 A1 | 3/2014 | Leung et al. | |
| 2014/0111953 A1* | 4/2014 | McClure | G06F 3/044 361/749 |
| 2014/0184525 A1* | 7/2014 | Kim | G06F 3/044 345/173 |
| 2015/0135108 A1 | 5/2015 | Pope et al. | |
| 2015/0153829 A1 | 6/2015 | Shiraishi | |
| 2015/0185909 A1 | 7/2015 | Gecnuk | |
| 2015/0185946 A1 | 7/2015 | Fourie | |
| 2015/0370376 A1 | 12/2015 | Harley et al. | |
| 2015/0370396 A1 | 12/2015 | Ogata et al. | |
| 2016/0033342 A1 | 2/2016 | Lyon et al. | |
| 2016/0041648 A1 | 2/2016 | Richards | |
| 2016/0042166 A1 | 2/2016 | Kang et al. | |
| 2016/0062498 A1 | 3/2016 | Huppi et al. | |
| 2016/0070404 A1 | 3/2016 | Kerr et al. | |
| 2016/0098131 A1 | 4/2016 | Ogata et al. | |
| 2016/0103542 A1 | 4/2016 | Ogata et al. | |
| 2016/0103544 A1 | 4/2016 | Filiz et al. | |
| 2016/0139716 A1 | 5/2016 | Filiz et al. | |
| 2016/0258981 A1 | 9/2016 | Bushnell et al. | |
| 2016/0314334 A1 | 10/2016 | He et al. | |
| 2016/0378255 A1 | 12/2016 | Butler et al. | |
| 2017/0046008 A1 | 2/2017 | Chen et al. | |
| 2017/0235403 A1 | 8/2017 | Miller et al. | |
| 2017/0285746 A1 | 10/2017 | Kim et al. | |
| 2017/0322660 A1 | 11/2017 | Kuboyama et al. | |
| 2018/0048058 A1 | 2/2018 | Ehman et al. | |
| 2018/0069588 A1 | 3/2018 | Jiang et al. | |
| 2018/0088702 A1 | 3/2018 | Shutzberg et al. | |
| 2018/0138102 A1 | 5/2018 | Pan et al. | |
| 2018/0275811 A1 | 9/2018 | Filiz et al. | |

FOREIGN PATENT DOCUMENTS

| | | |
|---|---|---|
| CN | 1582453 | 2/2005 |
| CN | 1707415 | 12/2005 |
| CN | 1714336 | 12/2005 |
| CN | 101046720 | 10/2007 |
| CN | 101207971 | 6/2008 |
| CN | 101427468 | 5/2009 |
| CN | 101630210 | 1/2010 |
| CN | 101673001 | 3/2010 |
| CN | 101950224 | 1/2011 |
| CN | 102016780 | 4/2011 |
| CN | 201828892 | 5/2011 |
| CN | 102087432 | 6/2011 |
| CN | 102103445 | 6/2011 |
| CN | 102138120 | 7/2011 |
| CN | 102193699 | 9/2011 |
| CN | 102299166 | 12/2011 |
| CN | 102365608 | 2/2012 |
| CN | 102449583 | 5/2012 |
| CN | 102467308 | 5/2012 |
| CN | 102478985 | 5/2012 |
| CN | 102483673 | 5/2012 |
| CN | 103221906 | 7/2013 |
| CN | 204650590 | 9/2015 |
| EP | 2073107 | 6/2009 |
| EP | 2128747 | 12/2009 |
| EP | 2237142 | 10/2010 |
| EP | 2267791 | 12/2010 |
| EP | 2315102 | 4/2011 |
| EP | 2315186 | 4/2011 |
| EP | 2357547 | 8/2011 |
| EP | 2413224 | 2/2012 |
| EP | 2418561 | 2/2012 |
| EP | 2420918 | 2/2012 |
| EP | 2508960 | 10/2012 |
| EP | 2660688 | 11/2013 |
| EP | 2708985 | 3/2014 |
| GB | 2313195 | 11/1997 |
| JP | S61292732 | 12/1986 |
| JP | 2005031425 | 2/2005 |
| JP | 2007310539 | 11/2007 |
| JP | 2010225031 | 10/2010 |
| JP | 2010244252 | 10/2010 |
| JP | 2011100364 | 5/2011 |
| JP | 2011134000 | 7/2011 |
| JP | 2011197991 | 8/2011 |
| JP | 2012064108 | 3/2012 |
| JP | 2014052997 | 3/2014 |
| KR | 1020070110114 | 11/2007 |
| KR | 1020100074005 | 7/2010 |
| WO | WO 97/018528 | 5/1997 |
| WO | WO 11/081882 | 7/2011 |
| WO | WO 11/156447 | 12/2011 |
| WO | WO 12/031564 | 3/2012 |
| WO | WO 12/147659 | 11/2012 |
| WO | WO 12/160844 | 11/2012 |
| WO | WO 13/083207 | 6/2013 |
| WO | WO 13/183191 | 12/2013 |
| WO | WO 14/018121 | 1/2014 |
| WO | WO 12/153555 | 7/2014 |
| WO | WO 14/124173 | 8/2014 |

OTHER PUBLICATIONS

Engineers Edge, Common Plastic Molding Design Material Specification, 2015, http://www.engineersedge.com/plastic/materials_common_plastic.htm, 3 pages.

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

Widdle, "Measurement of the Poisson's ratio of flexible polyurethane foam and its influence on a uniaxial compression model," International Journal of Engineering Science, vol. 46, 2008, pp. 31-49.

* cited by examiner

ELECTRONIC WATCH WITH OBSCURED SENSOR FOR DETECTING AN APPLIED FORCE

CROSS-REFERENCE TO RELATED APPLICATION

This application is a continuation of U.S. patent application Ser. No. 14/641,150, filed Mar. 6, 2015, and entitled "Capacitive Sensors for Electronic Devices and Methods of Forming the Same," the contents of which are incorporated herein by reference as if fully disclosed herein.

TECHNICAL FIELD

The disclosure relates generally to electronic sensors, and more particularly to capacitive sensor assemblies for electronic devices, and methods of forming the capacitive sensor assemblies.

BACKGROUND

Conventional electronic devices typically include a variety of distinct input devices formed from a plurality of components. For example, conventional electronic devices typically include a touch display to allow a user to interact with the device. Touch displays typically include a plurality of sensor assemblies that may be positioned inside the casing of the electronic device. The sensor assemblies may be used to detect when a user touches an external surface of the electronic device with the desire to interact with the device. When the sensor assemblies detect a user's touch, the sensor assemblies may send an electrical input signal to distinct portions of the electronic device.

Conventional sensor assemblies include a plurality of layers and/or components to detect the user's touch or interaction with the electronic device. However, as the number of layers and/or components increase in the sensor assemblies, so does the required space for housing the assembly within the electronic device. That is, as the number of layers and/or components increase in the sensor assemblies, the over height and/or z-space of the sensor assemblies also increases.

Additionally, a bond must be formed between all layers and/or components of the conventional sensor assemblies. With an increase in the layers and/or components, the likelihood of a bonding of the assembly to come undone or uncoupled increases. Where two layers or components of the sensor assembly come uncoupled, the sensor assembly may have reduced operational function, or may become inoperable.

SUMMARY

Generally, embodiments discussed herein are related to electronic sensors, and more particularly to capacitive sensor assemblies for electronic devices, and methods of forming the capacitive sensor assemblies. The capacitive sensor assemblies discussed herein may reduce the number of layers and/or components forming the assembly by utilizing a silicone layer positioned between electrical traces, and/or forming the electrical traces within or out of pre-existing layers of the electronic device. By utilizing a silicone layer within the capacitive sensor assembly, a strong bond may be formed between the silicone layer and the distinct layers and/or components of the capacitive sensor assembly and/or components of the electronic device. Additionally, by forming the electrical traces of the capacitive sensor assembly within or out of pre-existing layers of the electronic device, the number of layers or components of the capacitive sensor assembly may be reduced, and the height or z-space of the capacitive sensor assembly may be reduced. As a result of the reduce number of layers or components, the risk of operational fault or failure may be reduced or eliminated. Additionally, as a result of the reduced height of the capacitive sensor assembly, the overall height and size of the electronic device implementing the capacitive sensor assembly may also be reduced.

One embodiment may take the form of a method of manufacturing a capacitive sensory assembly in an electronic device. The method may comprise coupling a silicone layer to a bottom portion of a housing of the electronic device, positioning a first electrical trace within a flex layer, the flex layer positioned on the silicone layer, opposite the bottom portion of the housing, and curing the silicone layer to the flex layer including the first electrical trace. The method may also comprise applying an adhesive to the flex layer including the first electrical trace, opposite the silicone layer, and coupling a cover of the electronic device to the flex layer using the applied adhesive.

An additional embodiment may take the form of a method of manufacturing a capacitive sensory assembly in an electronic device. The method may comprise coupling an intermediate layer on a at least a portion of an inner surface of a cover of the electronic device, etching a portion of the intermediate layer to form a first electrical trace in the etched portion, positioning a silicone layer between the intermediate layer and a bottom portion of a housing of the electronic device, and curing the silicone layer to the intermediate layer including the first electrical trace.

Another embodiment may take the form of an electronic device comprising a housing having a top portion, and a bottom portion coupled to the top portion. The electronic device may also comprise a capacitive sensor assembly positioned within the housing. The capacitive sensor comprises a silicone layer positioned between the top portion and the bottom portion of the housing, a flex layer coupled to the silicone layer, and a first electrical trace positioned within the flex layer.

A further embodiment may take the form of an electronic device comprising a housing, a cover glass coupled to the housing, an intermediate layer formed on an inner surface of the cover glass, and a capacitive sensor assembly positioned between the housing and the cover glass. The capacitive sensor comprising a silicone layer coupled to the intermediate layer formed on the inner surface of the cover glass, and a first electrical trace positioned within the intermediate layer, adjacent the silicone layer.

BRIEF DESCRIPTION OF THE DRAWINGS

The disclosure will be readily understood by the following detailed description in conjunction with the accompanying drawings, wherein like reference numerals designate like structural elements, and in which.

Figure 1:
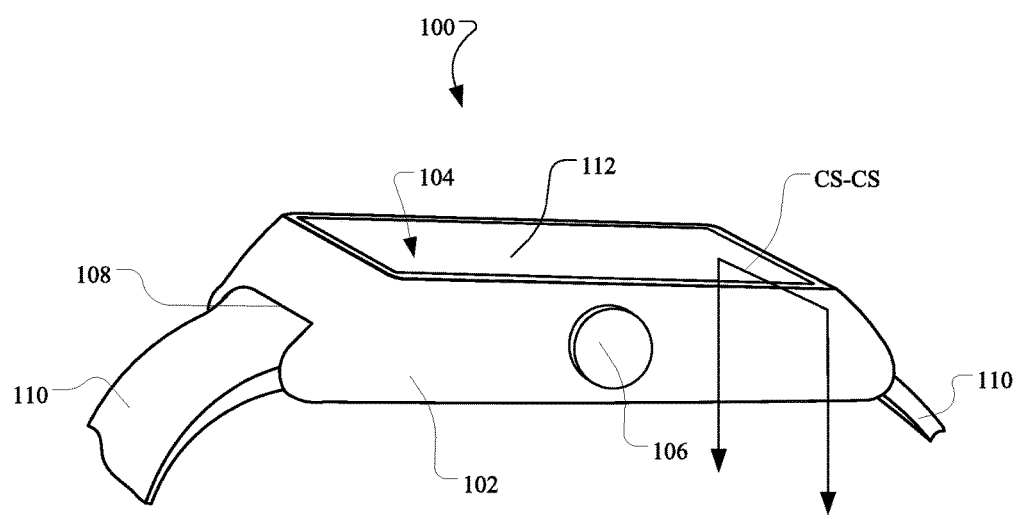
FIG. 1 depicts an illustrative perspective view of a portion of a wearable electronic device, according to embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to electronic sensors, and more particularly to capacitive sensor assemblies for electronic devices, and methods of forming the capacitive sensor assemblies.

The capacitive sensor assemblies discussed herein may reduce the number of layers and/or components forming the assembly by utilizing a silicone layer positioned between electrical traces, and/or forming the electrical traces within or out of pre-existing layers of the electronic device. By utilizing a silicone layer within the capacitive sensor assembly, a strong bond may be formed between the silicone layer and the distinct layers and/or components of the capacitive sensor assembly and/or components of the electronic device. Additionally, by forming the electrical traces of the capacitive sensor assembly within or out of pre-existing layers of the electronic device, the number of layers or components of the capacitive sensor assembly may be reduced, and the height or z-space of the capacitive sensor assembly may be reduced. As a result of the reduce number of layers or components, the risk of operational fault or failure may be reduced or eliminated. Additionally, as a result of the reduced height of the capacitive sensor assembly, the overall height and size of the electronic device implementing the capacitive sensor assembly may also be reduced.

These and other embodiments are discussed below with reference to FIGS. 1-10C. However, those skilled in the art will readily appreciate that the detailed description given herein with respect to these Figures is for explanatory purposes only and should not be construed as limiting.

FIG. 1 shows an illustrative perspective view of a portable or wearable electronic device 100 (hereafter, "electronic device"), according to embodiments. Electronic device 100, as shown in FIG. 1, may be configured to provide health-related information or data such as but not limited heart rate data, blood pressure data, temperature data, oxygen level data, diet/nutrition information, medical reminders, health-related tips or information, or other health-related data. The electronic device may optionally convey the health-related information to a separate electronic device such as a tablet computing device, phone, personal digital assistant, computer, and so on. In addition, electronic device 100 may provide additional information, such as but not limited to, time, date, health, statuses or externally connected or communicating devices and/or software executing on such devices, messages, video, operating commands, and so forth (and may receive any of the foregoing from an external device), in addition to communications.

Electronic device 100 may include a housing 102 at least partially surrounding a display 104 and one or more buttons 106 or input devices. The housing 102 may form an outer surface or partial outer surface and protective case for the internal components of electronic device 100, and may at least partially surround the display 104. The housing 102 may be formed of one or more components operably connected together, such as a front piece and a back piece. Alternatively, the housing 102 may be formed of a single piece operably connected to the display 104. Housing 102 may formed from a plurality of distinct materials including, but not limited to: corundum, commonly referred to as sapphire, glass or plastic. As discussed herein, and in another example, housing 102 may be formed from an electrically conductive material, or a material having electrically conductive properties.

Display 104 may be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology.

Button 106 may include any conventional input/output (I/O) device for electronic device 100. Specifically, button 106 may include an actuation component in electronic and/or mechanical communication with the internal components of electronic device 100, to provide user input and/or allow the user to interact with the various functions of electronic device 100. In an embodiment button 106 may be configured as a single component surrounded by housing 102. Alternatively, button 106 may include a plurality of components, including an actuation component, in mechanical/electrical communication with one another and/or internal component of electronic device 100. Button 106 may likewise include a sensor, such as a biometric sensor, touch sensor, or the like.

Housing 102 may also have recesses 108 formed on opposite ends to connect a wearable band 110 (partially shown in FIG. 1) to electronic device 100. Wearable band 110 may be used to secure wearable electronic device 100 to a user, or any other object capable of receiving electronic device 100. In a non-limiting example where electronic device 100 is a smart watch, wearable band 110 may secure the watch to a user's wrist. In other non-limiting examples, electronic device 100 may secure to or within another part of a user's body.

A cover 112 may be positioned above the touchscreen of display 104. That is, and as discussed herein, cover 112 may be positioned above the touchscreen of display 104 and may be at least partially positioned within an opening of housing 102 and coupled to housing 102. Cover 112 may protect display 104 from containments, without obstructing a user's view and/or ability to interact with display 104 and/or electronic device 100. As such, cover 112 may be transparent or translucent, fully or partially, in certain embodiments. As discussed herein, cover 112 may be formed corundum, commonly referred to as sapphire. However, it is understood that cover 112 may be formed from any suitable transparent material and/or combination of suitable transparent material including, but not limited to, ceramics, alumina, chemically strengthened glass, and reinforced plastic.

Figure 2:
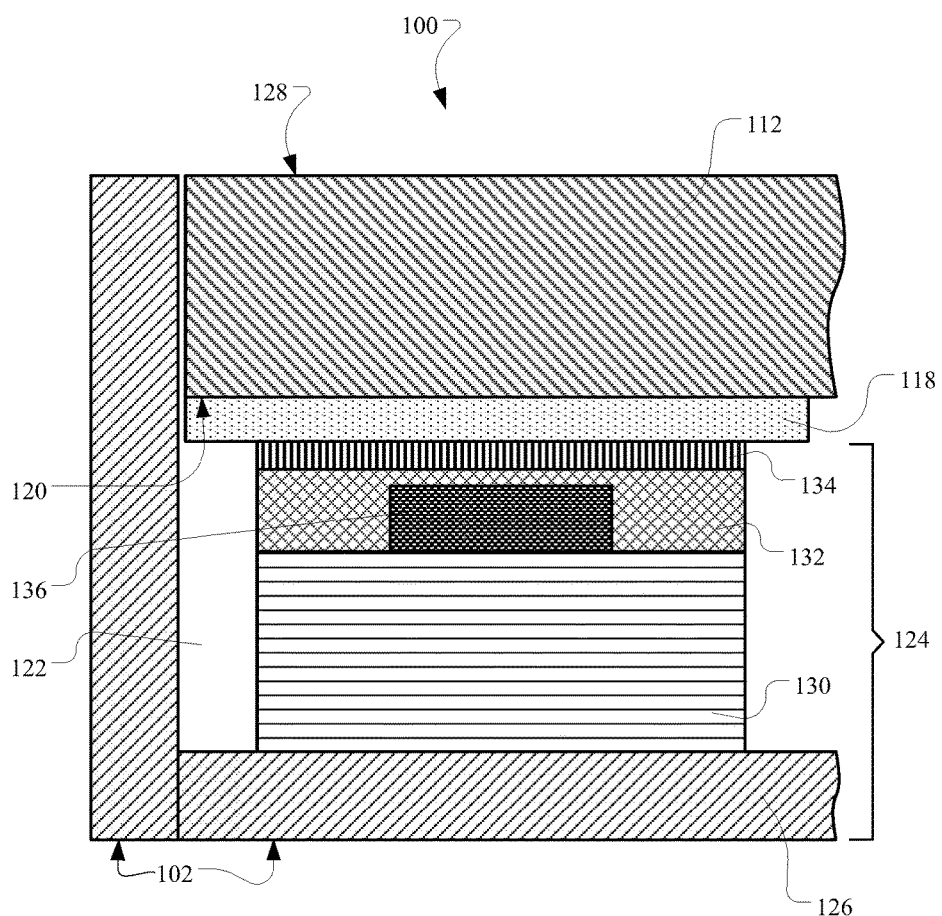
FIG. 2 depicts an illustrative cross-section side view of a portion of the electronic device of FIG. 1 including a capacitive sensor assembly, taken along line CS-CS, according to embodiments.

FIG. 2 depicts an enlarged cross-section front view of a portion of electronic device 100 of FIG. 1 taken along line CS-CS, according to an embodiment. With respect to this particular embodiment, FIG. 2 shows a cross-section front view of a portion of housing 102 and cover 112 of electronic device 100. Electronic device 100 may also include an intermediate layer 118 formed on at least a portion inner surface 120 of cover 112. Intermediate layer 118 formed on cover 112 may be positioned within an opening 122 formed between cover 112 and housing 102, and may not be exposed in electronic device 100. Intermediate layer 118 may be optically dense and/or substantially translucent or opaque, such that a user of electronic device 100 may not be able to see through the portion of cover 112 positioned above intermediate layer 118. In a non-limiting example shown in FIG. 2, and as a result of the optical properties, intermediate layer 118 may be positioned around a perimeter of cover 112 to define an interactive area of electronic device 100, adjacent the intermediate layer 118. The interactive area of electronic device 100 may include the touch screen of display 104 (see, FIG. 1), as discussed herein.

Intermediate layer 118 may be formed from a variety of materials. In a non-limiting example, intermediate layer 118 may be formed from an ink material. The ink material may be deposited on inner surface 120 of cover 112 using any suitable deposition technique or process including, but not limited to, painting, spraying, mask-and-ink submersion and the like. In another non-limiting example, intermediate layer 118 may be formed as a substantially solid material layer. In the non-limiting example, the substantially solid material layer may be formed as a plastic layer that may be coupled to inner surface 120 of cover 112. The plastic layer may be coupled to the inner surface 120 using any suitable coupling technique or process (e.g., bonding, welding, melting, and so on).

Electronic device 100 may also include a capacitive sensor assembly 124 positioned within housing 102. In a non-limiting example shown in FIG. 2, capacitive sensor assembly 124 may be substantially positioned between cover 112 and a bottom portion or component 126 of housing 102. As discussed herein, bottom portion or component 126 may be formed from distinct material and/or a distinct component than the remainder of housing 102. Capacitive sensor assembly 124 may be in electrical communication with display 104 and/or additional components of electronic device 100, and may be configured to detect input provide to electronic device 100 via cover 112. That is, when a force is applied to outer surface 128 of cover 112 to interact with display 104 (see, FIG. 1) and/or other components of electronic device 100, cover 112 may substantially deflect and/or flex toward bottom portion or component 126 of housing 102. As a result, capacitive sensor assembly 124 may sense or detect the deflection of cover 112 to provide an input to electronic device 100.

Capacitive sensor assembly 124 may include a silicone layer 130 positioned within opening 122 of electronic device 100. Silicone layer 130 may be positioned between intermediate layer 118 formed on inner surface 120 of cover 112 and housing 102, and in the non-limiting example shown in FIG. 2, silicone layer 130 may be coupled directly to bottom portion or component 126 of housing 102. As discussed herein, silicone layer 130 may be coupled to bottom portion or component 126 using any suitable coupling technique including, but not limited to, injection molded, cured, adhered or the like. In certain embodiments, the silicone layer 130 may mechanically couple adjacent layers to one another, such as the adjacent layers shown in FIG. 2 and subsequent figures, such as bottom component 126 and flex layer 132.

Silicone layer 130 may also be substantially compliant, flexible and/or elastic. As a result, when a force is applied to cover 112, silicone layer 130 may substantially deform to allow electrical traces of capacitive sensor assembly 124 to move toward each other to vary a capacitance between the traces, and ultimately generate an electrical signal to be sent to electronic device 100 based on the applied force, as discussed herein. Additionally, the physical properties compliance and/or elasticity of silicone layer 130 may allow portions of capacitive sensor assembly 124 (e.g., electrical traces) to return to a neutral state (e.g., "spring-back" to an uncompressed position) relatively rapidly, thereby permitting the detection of a consecutively-applied forces being applied to cover 112 of electronic device 100. Further, and as discussed herein, silicone layer 130 may be positioned between two electrical traces of capacitive sensor assembly 124 to separate the traces in order to detect the force applied to cover 112.

Capacitive sensor assembly 124 may also include a flex layer 132. In a non-limiting example shown in FIG. 2, flex layer 132 may be positioned between silicone layer 130 and intermediate layer 118. As discussed herein, flex layer 132 may be bonded and/or coupled to silicone layer 130 of capacitive sensor assembly 124 using a variety of coupling or bonding techniques (e.g., adhesive, curing, and so on). Additionally, an adhesive 134 may be used to couple flex layer 132 to intermediate layer 118 of electronic device 100. In the non-limiting example shown in FIG. 2, adhesive 134 may be a pressure sensitive adhesive that may completely cover flex layer 132 and may be positioned between flex layer 132 and intermediate layer 118 to couple or bond flex layer 132 to cover 112 via intermediate layer 118. The use of adhesive 134 to bond flex layer 132 to intermediate layer 118 and/or cover 112, as well as the other connections, couplings and/or bonds formed between the various layers or components of capacitive sensor assembly 124, may result in a hermetic seal being formed within electronic device 100.

Similar to silicone layer 130 of capacitive sensor assembly 124, flex layer 132 may include substantially compliant, flexible and/or elastic properties. In a non-limiting example, flex layer may be formed from an elastomeric material. As a result, and as discussed herein with respect to silicone layer 130, when a force is applied to cover 112, flex layer 132 may also deform and/or flex toward bottom portion or component 126. Additionally, when the force on cover 112 is removed or discontinued, flex layer 132 may return or "spring-back" to a neutral state (e.g., uncompressed position).

A first electrical trace 136 may be positioned or formed within flex layer 132 of capacitive sensor assembly 124. In a non-limiting example shown in FIG. 2, first electrical trace 136 may be positioned within flex layer 132 coupled to silicone layer 130, such that first electrical trace 136 may be positioned between silicone layer 130, and intermediate layer 118 and/or cover 112 of electronic device 100. First electrical trace 136 may have capacitive characteristics and/or first electrical trace 136 may be formed from an electrically conductive material, for example copper. Although only a single first electrical trace 136 is shown in FIG. 2, it is understood that capacitive sensor assembly 124 may include a group of electrical traces forming first electrical trace(s) 136.

In the non-limiting example shown in FIG. 2, and as discussed herein, first electrical trace 136 may be a driven capacitive trace that may cooperate with an additional electrical trace of capacitive sensor assembly 124 to detect a force applied to cover 112 of electronic device 100 by measuring changes in capacitance between the cooperating electrical traces of capacitive sensor assembly 124. By measuring the changes in capacitance, capacitive sensor assembly 124 may detect the force applied to cover 112 and may subsequently provide an electrical signal to display 104 and/or additional components of electronic device 100, as discussed herein.

As discussed herein, bottom portion or component 126 of housing 102 may be formed from a distinct component or material from the remainder of housing 102 of electronic device 100. Where capacitive sensor assembly 124 includes only a single electrical trace (e.g., first electrical trace 136) formed between cover 112 and bottom portion or component 126 of housing 102, bottom portion or component 126 may form a cooperating electrical trace for first electrical trace 136. In a non-limiting example shown in FIG. 2, bottom portion or component 126 of housing 102 may be formed from an electrically conductive material (e.g., copper) and may provide a cooperating electrical trace structure for first electrical trace 136. Where first electrical trace 136 forms a driven capacitive trace, bottom portion or component 126 may form a sense capacitive trace that may cooperate with first electrical trace 136.

First capacitive sensor assembly 124 may detect a force applied to cover 112 by measuring the change in capacitance between first electrical trace 136 and the cooperating electrical trace formed by bottom portion or component 126 of housing 102. In a non-limiting example, a continuous charge or current may be provided to both first electrical trace 136 and bottom portion or component 126. The charge or current may provide a predetermined steady-state or uncompressed, measurable capacitance between first electrical trace 136 and bottom portion or component 126. When a force is applied to cover 112 of electronic device 100, cover 112, flex layer 132 and/or silicone 130 may deflect and/or may flex toward bottom portion or component 126 of housing 102, as discussed herein. This may also cause first electrical trace 136 to deflect toward bottom portion or component 126 of housing 102, resulting in the distance and the capacitance between first electrical trace 136 and bottom portion or component 126 to change. When the capacitance between first electrical trace 136 and bottom portion or component 126 changes, capacitive sensor assembly 124 may detect that a force has been applied to cover 112, and may subsequently send an electrical signal to display 104 and/or distinct components of electronic device 100.

Figure 3:
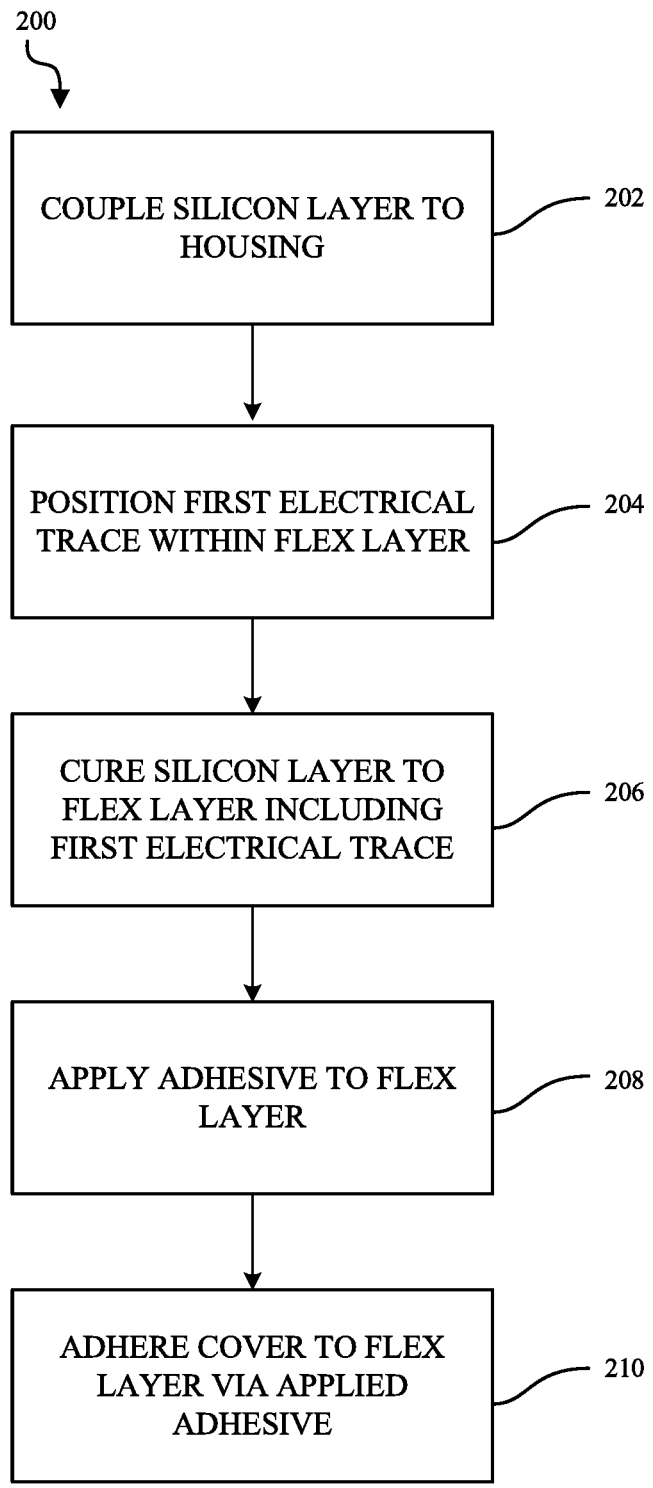
FIG. 3 depicts a flow chart of an example process for forming a capacitive sensor assembly for an electronic device, according to embodiments.

FIG. 3 depicts an example process for forming a capacitive sensor assembly for an electronic device. Specifically, FIG. 3 is a flowchart depicting one example process 200 for forming a capacitive sensor assembly having cooperating electrical traces formed from a first electrical trace and an electrically conductive housing. In some cases, process 200 may be used to form one or more capacitive sensor assemblies, as discussed above with respect to FIG. 2.

In operation 202, a silicone layer is coupled or bonded to a bottom portion or component of a housing. In operation 204, a first electrical trace may be positioned within a flex layer positioned on the silicone layer. In operation 206, the silicone layer may be cured or bonded to the flex layer including the first electrical trace. In operation 208, an adhesive may be applied to the flex layer including the first electrical trace. In operation 210, a cover or top portion or component of the housing may be adhered to the flex layer using the applied adhesive.

FIGS. 4A-4D show capacitive sensor assembly 124 for electronic device 100 (see, FIG. 4D) undergoing various operations that may be performed in accordance with process 200 of FIG. 3. It is understood that similarly numbered components may function in a substantially similar fashion. Redundant explanation of these components has been omitted for clarity.

Figure 4A:
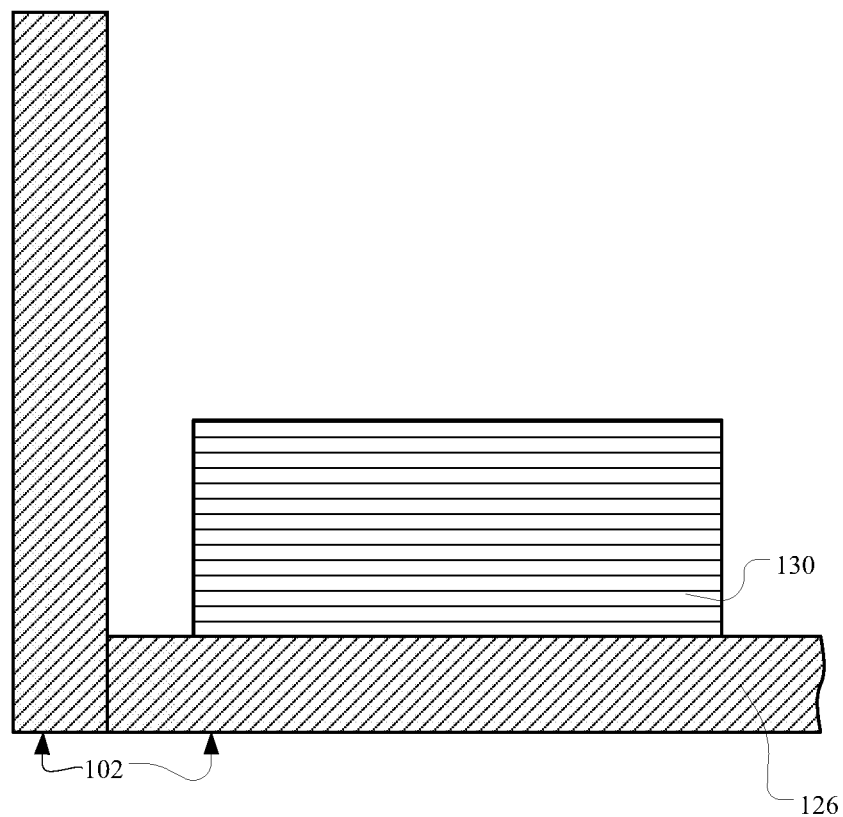
FIGS. 4A-4D depict illustrative cross-section side views of a portion of the electronic device of FIG. 1 and various components of a capacitive sensor assembly undergoing the process depicted in FIG. 3, according to embodiments.

As shown in FIG. 4A, silicone layer 130 may be coupled or bonded to a portion of bottom portion or component 126 of housing 102. Silicone layer 130 may be coupled or bonded to bottom portion or component 126 using a variety of bonding techniques. In a non-limiting example, silicone material forming silicone layer 130 may be injection molded onto bottom portion or component 126 of housing 102. In another non-limiting example, silicone layer may be die-cut to shape and subsequently installed or positioned on bottom portion or component 126 of housing 102. The die-cut silicone layer 130 may be positioned on bottom portion or component 126 in a uncured state. Silicone layer 130 may be subsequently cured to bottom portion or component 126 immediately after being positioned on housing 102, or during a subsequent curing process involving silicone layer 130 and distinct layers of capacitive sensor assembly 124, as discussed herein. The coupling or bonding of silicone layer 130 to bottom portion or component 126 shown in FIG. 4A may correspond to operation 202 in FIG. 2.

Figure 4B:
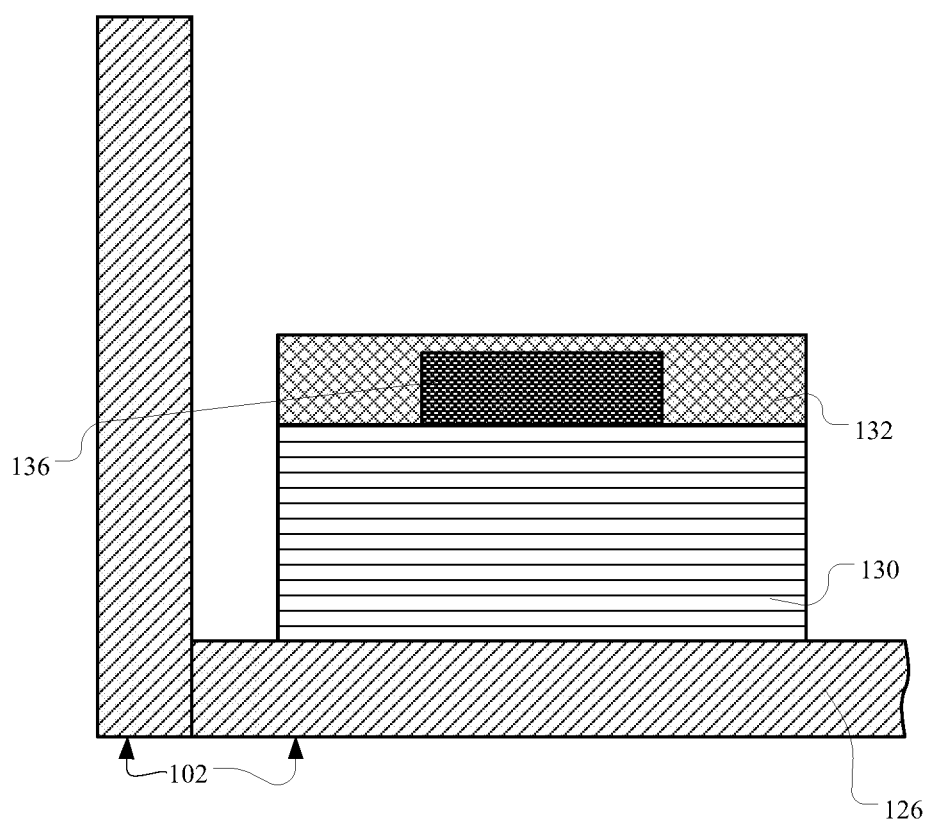

FIG. 4B shows first electrical trace 136 positioned within flex layer 132 positioned over silicone layer 130. First electrical trace 136 may be positioned within flex layer 132 using a variety of techniques. In a non-limiting example, a portion of the material forming flex layer 132 may be deposited over silicone layer 130 using any suitable material deposition technique, and first electrical trace may be positioned over the portion of flex layer 132 deposited on silicone layer 130. Subsequent to positioning first electrical trace 136 on the deposited portion of the material forming flex layer 132, the remaining material used to form flex layer 132 may be deposited over first electrical trace 136. In another non-limiting example, flex layer 132 may be formed over silicone layer 130, and a trench may be formed in a portion of flex layer 132 to receive first electrical trace 136. In the non-limiting example, first electrical trace 136 may be positioned within the trench, and additional material used to form flex layer 132 may fill in the remaining portion of the trench. The positioning of first electrical trace 136 within flex layer 132 shown in FIG. 4B may correspond to operation 204 in FIG. 2.

FIG. 4B may also show silicone layer 130 cured to flex layer 132 including first electrical trace 136. In a non-limiting example, housing 102, silicone layer 130 and flex layer 132 including first electrical trace 136 may undergo a curing process to cure or bond silicone layer 130 to flex layer 132. Additionally, and as discussed herein with respect to FIG. 4A, silicone layer 130 may undergo the curing process to cure or bond silicone layer 130 to bottom portion or component 126 of housing 102. The curing of silicone layer 130 to flex layer 132 including first electrical trace 136 shown in FIG. 4B may correspond to operation 206 in FIG. 2.

Figure 4C:
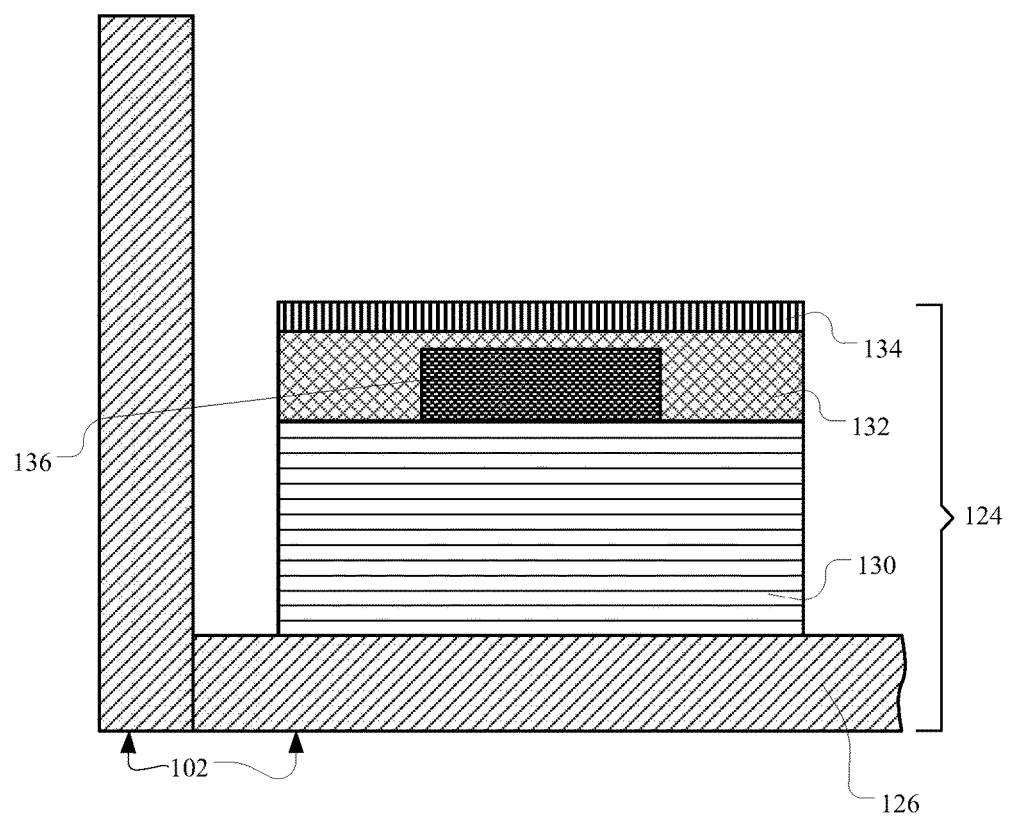

FIG. 4C shows an adhesive 134 applied to flex layer 132. In the non-limiting example shown in FIG. 4C, adhesive 134 may be applied to the entire exposed surface of flex layer 132 to ensure a desired bond is achieved between flex layer 132 and subsequent components of electronic device 100 (e.g., cover 112). As discussed herein, adhesive 134 may be a pressure sensitive adhesive. Additionally, adhesive 134 may take the form of any medium associated with adhesives including, but not limited to, tape, spray and paste. The applying of adhesive 134 to flex layer 132 shown in FIG. 4C may correspond to operation 208 in FIG. 2.

Figure 4D:
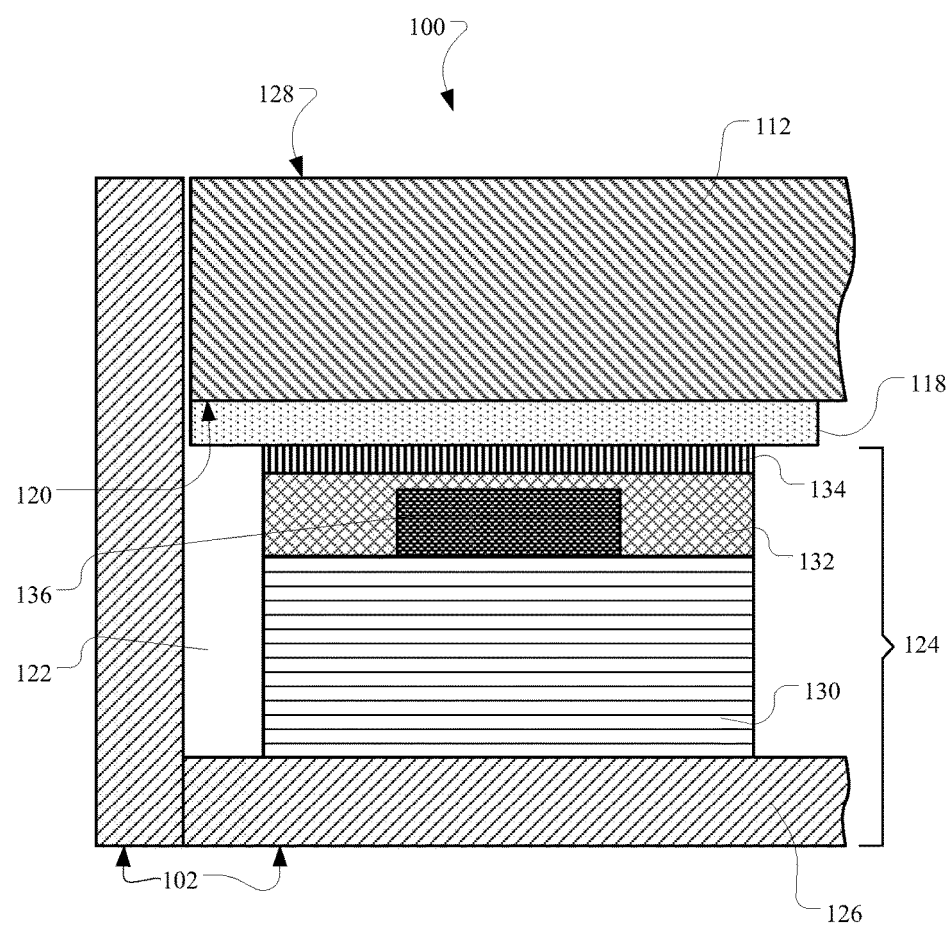

FIG. 4D shows cover 112 adhered to flex layer 132 using adhesive 134. In the non-limiting example shown in FIG. 4D, intermediate layer 118 formed on inner surface 120 of cover 112 may be coupled directly to adhesive 134 to couple cover 112 to flex layer 132. Where adhesive 134 is formed as a pressure sensitive adhesive, cover 112 may be pressed into adhesive 134 to form the bond and/or to adhere cover 112 to flex layer 132. By adhering cover 112 to flex layer 132 using adhesive 134, a hermetic seal may be formed within electronic device 100 between cover 112, housing 102 and the various layers and components of capacitive sensor assembly 124. The hermetic seal may prevent debris, such as dust or water, from entering electronic device 100 and causing damage to the internal components of electronic device 100. The adhering of the cover 112 to flex layer 132 using adhesive 134 shown in FIG. 4D may correspond to operation 210 in FIG. 2.

Figure 5:
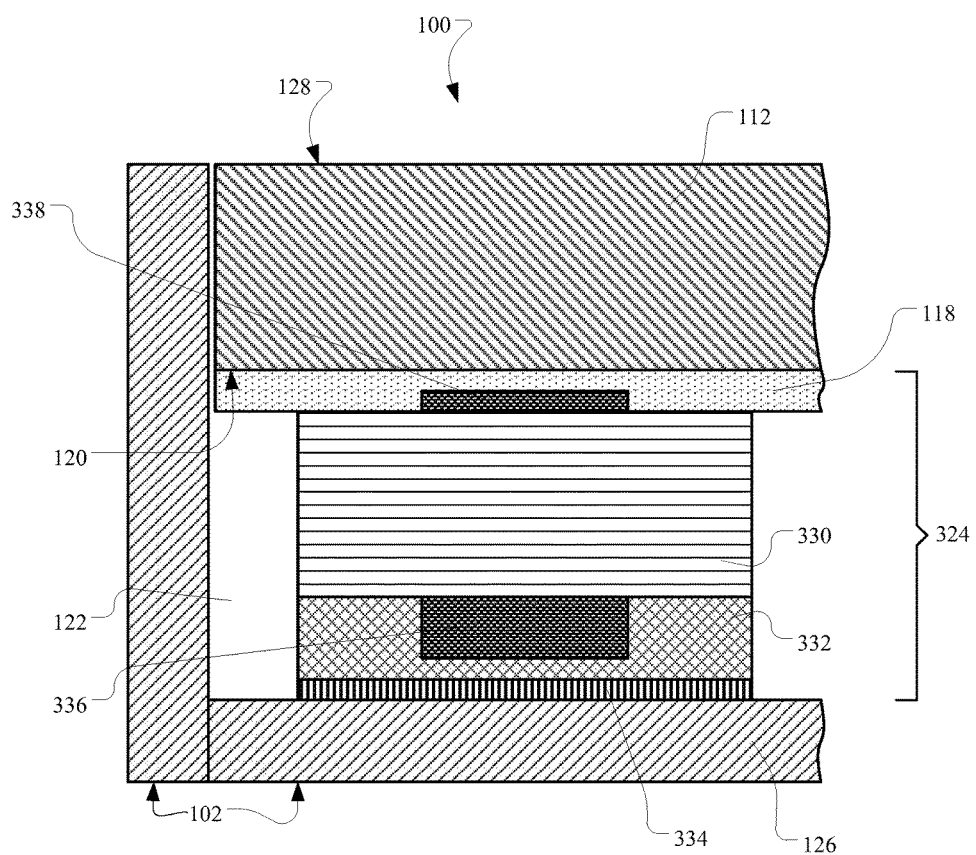
FIG. 5 depicts an illustrative cross-section side view of a portion of the electronic device of FIG. 1 including a capacitive sensor assembly, taken along line CS-CS, according to additional embodiments.

FIG. 5 depicts an enlarged cross-section front view of a portion of electronic device 100 of FIG. 1 taken along line CS-CS, according to another embodiment. Electronic device 100 shown in FIG. 5 includes a capacitive sensor assembly 324 having a distinct configuration from capacitive sensor assembly 124 discussed herein with respect to FIGS. 2-4D. It is understood that similarly numbered and/or named components of electronic device 100 and capacitive sensor assembly 324 may function in a substantially similar fashion. Redundant explanation of these components has been omitted for clarity.

As shown in FIG. 5, and as similarly discussed herein with respect to FIG. 2, first electrical trace 336 may be positioned or formed within flex layer 332. However, distinct from first electrical trace 136 of FIG. 2, first electrical trace 336, and flex layer 332, may be positioned between silicone layer 330 and bottom portion or component 126 of housing 102. As shown in the non-limiting example of FIG. 5, flex layer 332 may be coupled to bottom portion or component 126 of housing 102 using adhesive 334. Additionally, flex layer 332 including first electrical trace 336 may be coupled or cured to silicone layer 330 of capacitive sensor assembly 324. As a result of the position of flex layer 332 in capacitive sensor assembly 324, and distinct from capacitive sensor assembly 124 of FIG. 2, silicone layer 330 may be directly coupled to or cured to intermediate layer 118 formed on inner surface 120 of cover 112.

Also distinct from capacitive sensor assembly 124 of FIG. 2, capacitive sensor assembly 324 may include a second electrical trace 338. In the non-limiting example shown in FIG. 5, second electrical trace 338 may be positioned within intermediate layer 118 formed on inner surface 120 of cover 112. Additionally, second electrical trace 338 may be positioned between silicone layer 330 and cover 112, and may also be positioned adjacent silicone layer 330, opposite first electrical trace 336 positioned within flex layer 332. Similar to first electrical trace 336, second electrical trace 338 may have capacitive characteristics and/or second electrical trace 338 may be formed from an electrically conductive material, for example copper. Although only a single first electrical trace 336 and second electrical trace 338 are shown in FIG. 5, it is understood that one or both of the electrical traces of capacitive sensor assembly 324 may include a group of electrical traces forming first electrical trace(s) 336 and/or second electrical trace(s) 338.

As discussed herein, second electrical trace 338 may be positioned or formed within intermediate layer 118 using any suitable laser etching processes. In a non-limiting example, and discussed in detail herein, a laser etching process used to form second electrical trace 338 may include a laser direct structuring (LDS) process. As a result of using an LDS process, intermediate layer 118 may be formed from a thermoplastic material that may be doped with metal-plastic additives.

Second electrical trace 338 of capacitive sensor assembly 324 may be a driven capacitive trace that may cooperate with first electrical trace 336 to detect a force applied to cover 112 by measuring changes in capacitance between the first electrical trace 336 and second electrical trace 338, as discussed herein. In the non-limiting example shown in FIG. 5, where second electrical trace 338 is a driven capacitive trace, first electrical trace 336 may be a sense capacitive trace that may cooperate with second electrical trace 338. As similarly discussed herein with respect to first electrical trace 136 and bottom portion or component 126 in FIG. 2, first electrical trace 336 and second electrical trace 338 of capacitive sensor assembly 324 may be utilized within electronic device 100 to detect a force applied to cover 112 by measuring a change in capacitance between the respective electrical traces 336, 338.

As a result of capacitive sensor assembly 324 including second electrical trace 338, bottom portion or component 126 of housing 102 may not be required to cooperate with first electrical trace 336 in order to measure a change in capacitance. As such, housing 102, and specifically, bottom portion or component 126 may be formed from any suitable material for electronic device, and may not necessarily be formed from a material having electrically conductive properties.

Figure 6:
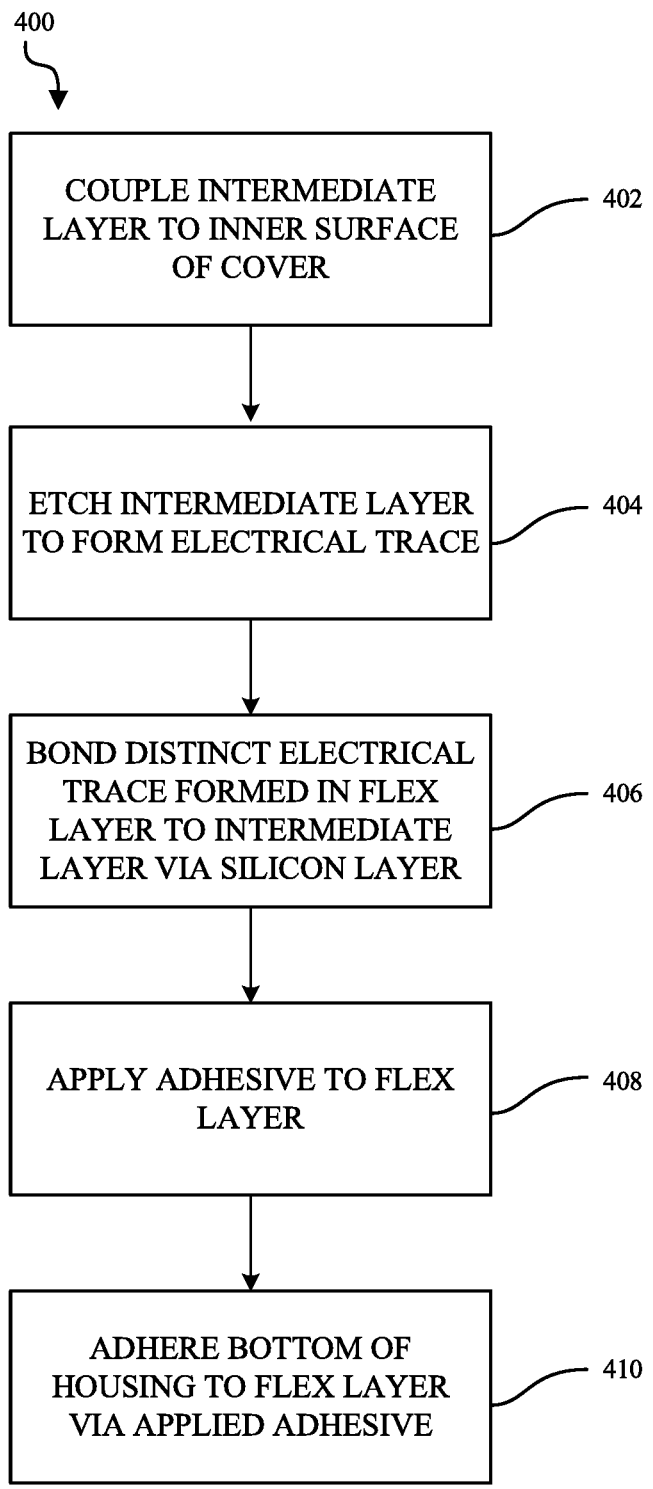
FIG. 6 depicts a flow chart of another example process for forming a capacitive sensor assembly for an electronic device, according to additional embodiments.

FIG. 6 depicts an example process for forming a capacitive sensor assembly for an electronic device. Specifically, FIG. 6 is a flowchart depicting one example process 400 for forming a capacitive sensor assembly having cooperating electrical traces formed from a first electrical trace and a second electrical trace. In some cases, process 400 may be used to form one or more capacitive sensor assemblies, as discussed above with respect to FIG. 5.

In operation 402, an intermediate layer may be coupled to an inner surface of a cover for an electronic device. In operation 404, a portion of the intermediate layer may be etched to form an electrical trace. In operation 406, a distinct electrical trace positioned within a flex layer is bonded to the intermediate layer using a silicone layer. In operation 408, an adhesive may be applied to the flex layer including the distinct electrical trace. In operation 410, a bottom portion or component of the housing may be adhered to the flex layer using the applied adhesive.

FIGS. 7A-7D show capacitive sensor assembly 324 for electronic device 100 (see, FIGS. 7C and 7D) undergoing various operations that may be performed in accordance with process 400 of FIG. 6. It is understood that similarly numbered components may function in a substantially similar fashion. Redundant explanation of these components has been omitted for clarity.

Figure 7A:
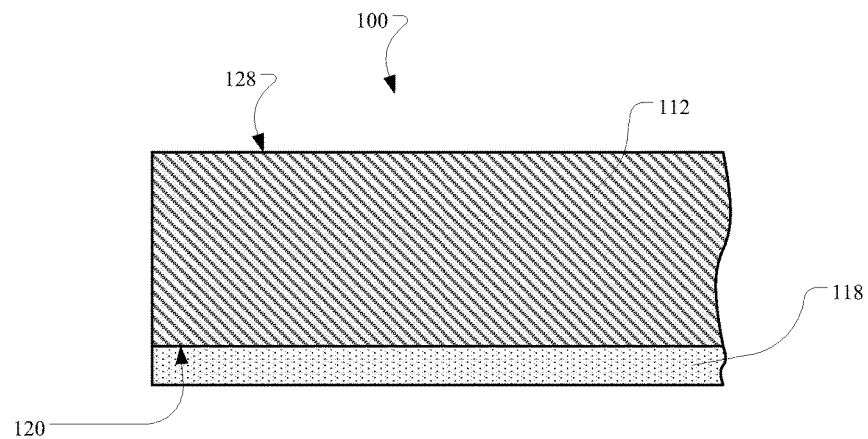
FIGS. 7A-7D depict illustrative cross-section side views of a portion of the electronic device of FIG. 1 and various components of a capacitive sensor assembly undergoing the process depicted in FIG. 6, according to additional embodiments.

As shown in FIG. 7A, intermediate layer 118 may be coupled to inner surface 120 of cover 112. Intermediate layer 118 may be formed from a variety of materials, and as such, may be coupled and/or applied to cover 112 using various techniques. In a non-limiting example, intermediate layer 118 may be formed from an ink material. The ink material may be deposited on inner surface 120 of cover 112 using any suitable deposition technique or process including, but not limited to, painting, spraying, mask-and-ink submersion and the like. In another non-limiting example, intermediate layer 118 may be formed as a substantially solid material layer. In the non-limiting example, the substantially solid material layer may be formed as a plastic layer that may be coupled to inner surface 120 of cover 112. The plastic layer may be coupled to the inner surface 120 using any suitable coupling technique or process (e.g., bonding, welding, melting, and so on). Furthermore, and as discussed in detail with respect to FIG. 7B, intermediate layer 118 may be formed from a thermoplastic material that may be doped with metal-plastic additives. The metal-plastic additives may be activated and/or react when exposed to a laser beam. The coupling of intermediate layer 118 to inner surface 120 of cover 112 shown in FIG. 7A may correspond to operation 402 in FIG. 6.

Figure 7B:
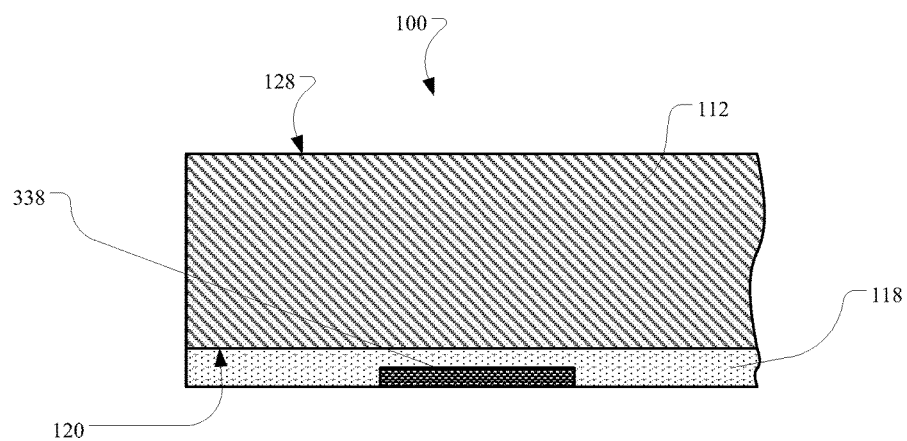

FIG. 7B shows intermediate layer 118 having undergone an etching process to form second electrical trace 338. Various etching processes may be performed on intermediate layer 118 to form second electrical trace 338. In a non-limiting example, intermediate layer 118 may undergo a laser direct structuring (LDS) process. During the LDS process, a portion of intermediate layer 118, formed from thermoplastic material having doped metal-plastic additives, may be exposed to a laser. The laser may cause the metal-plastic additives to react or activate, which may result in the exposed portions of intermediate layer 118 to change in chemical composition. The intermediate layer 118 may be subsequently dunked in a bath of a metal material (e.g., copper), where the exposed portions of intermediate layer 118 may attract the metal material to form second electrical trace 338. In another non-limiting embodiment, intermediate layer 118 may be masked and subsequently etched to form a trench in a portion of intermediate layer 118. Conductive material (e.g., copper) may then be deposited within the trench formed in intermediate layer 118 to form second electrical trace 338. The etching of intermediate layer 118 to form second electrical trace 338 shown in FIG. 7B may correspond to operation 404 in FIG. 6.

Figure 7C:
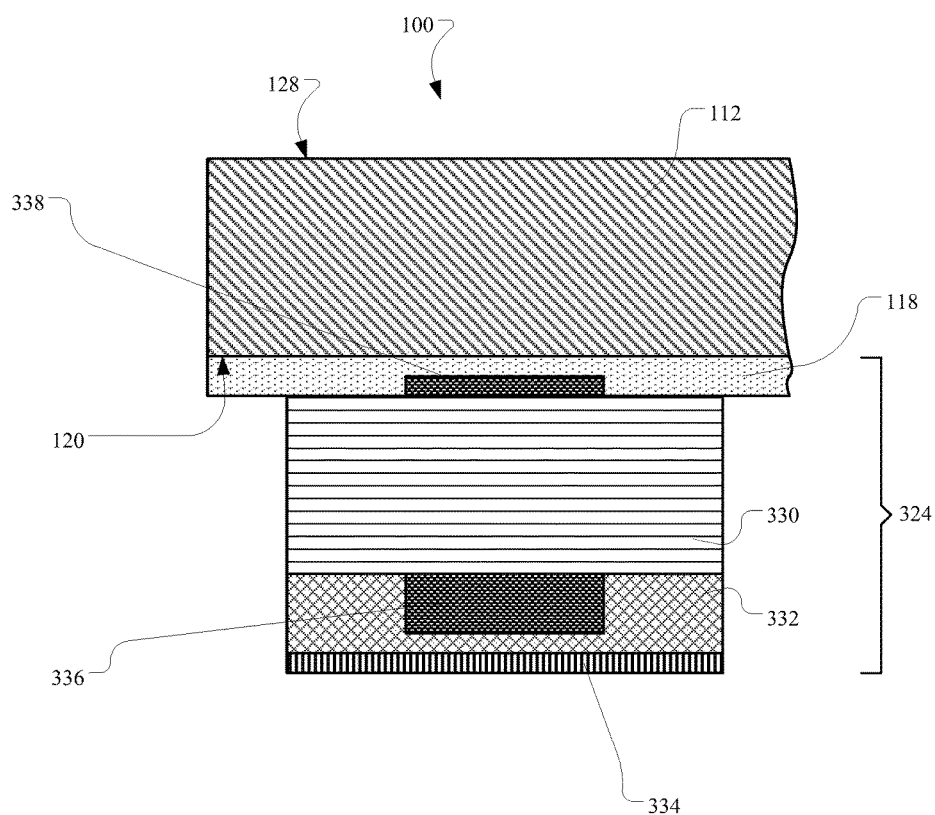

FIG. 7C shows flex layer 332 including first electrical trace 336 coupled or bonded to intermediate layer 118 via silicone layer 330. That is, flex layer 332 may be coupled or bonded to silicone layer 330, and intermediate layer 118 may also be coupled or bonded to silicone layer 330 opposite flex layer 332. In the non-limiting example, silicone layer 330 may be coupled or bonded to intermediate layer 118 including second electrical trace 338 using a variety of bonding techniques. In a non-limiting example, silicone material forming silicone layer 330 may be injection molded onto intermediate layer 118. In another non-limiting example, silicone layer 330 may be die-cut to shape and subsequently installed or positioned on intermediate layer 118. The die-cut silicone layer 330 may be positioned on intermediate layer 118 in a uncured state. Silicone layer 330 may be subsequently cured to intermediate layer 118 immediately after being positioned on intermediate layer 118, or during a subsequent curing process involving silicone layer 330 and distinct layers of capacitive sensor assembly 324, as discussed herein.

As similarly discussed herein with respect to FIG. 4B, first electrical trace 336 may be positioned within flex layer 332 using a variety of techniques. In a non-limiting example, a portion of the material forming flex layer 332 may be deposited over silicone layer 330 using any suitable material deposition technique, and first electrical trace 336 may be positioned over the portion of flex layer 332 deposited on silicone layer 330. Subsequent to positioning first electrical trace 336 on the deposited portion of the material forming flex layer 332, the remaining material used to form flex layer 332 may be deposited over first electrical trace 336. In another non-limiting example, flex layer 332 may be formed over silicone layer 330, and a trench may be formed in a portion of flex layer 332 to receive first electrical trace 336. In the non-limiting example, first electrical trace 336 may be positioned within the trench, and additional material used to form flex layer 332 may fill in the remaining portion of the trench.

Additionally, and also discussed herein with respect to FIG. 4B, silicone layer 330 may be cured to flex layer 332 including first electrical trace 336. In a non-limiting example, cover 112, intermediate layer 118, silicone layer 330 and flex layer 332 including first electrical trace 336 may undergo a curing process to cure or bond silicone layer 330 to flex layer 332. Silicone layer 330 may undergo the curing process to cure or bond silicone layer 330 to intermediate layer 118 formed on cover 112. The coupling or bonding of flex layer 332 and/or silicone layer 330 to intermediate layer 118 shown in FIG. 7C may correspond to operation 406 in FIG. 6.

FIG. 7C may also show an adhesive 334 applied to flex layer 332. In the non-limiting example shown in FIG. 7C, adhesive 334 may be applied to the entire exposed surface of flex layer 332 to ensure a desired bond is achieved between flex layer 332 and subsequent components of electronic device 100 (e.g., bottom portion or component 126 of housing 102). As discussed herein, adhesive 334 may be a pressure sensitive adhesive. Additionally, adhesive 334 may take the form of any medium associated with adhesives including, but not limited to, tape, spray and paste. The applying of adhesive 334 to flex layer 332 shown in FIG. 7C may correspond to operation 408 in FIG. 6.

Figure 7D:
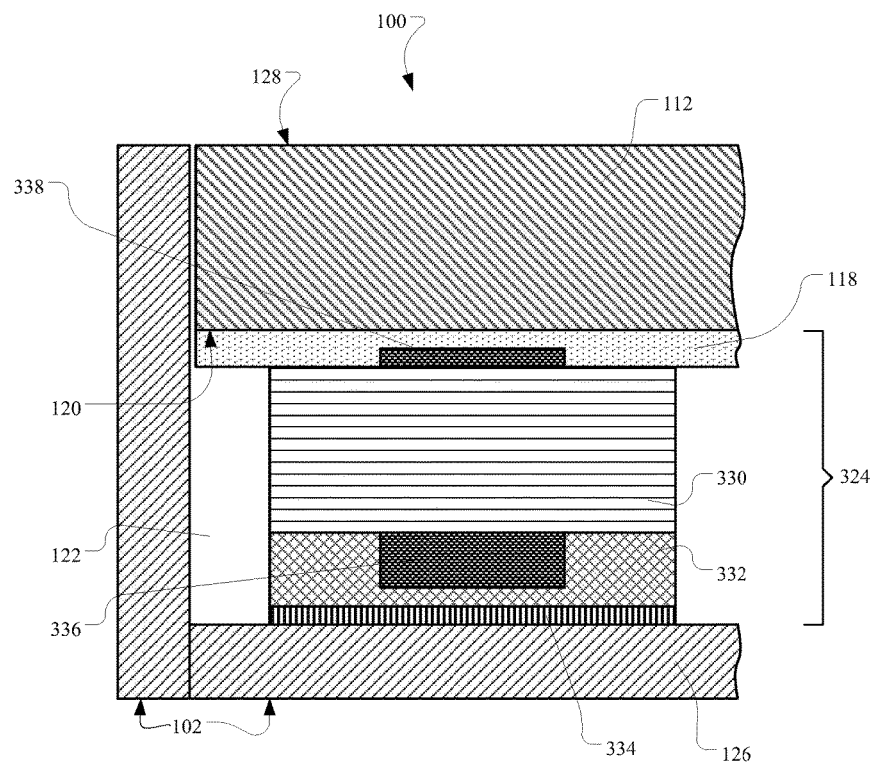

FIG. 7D shows bottom portion or component 126 of housing 102 adhered to flex layer 332 using adhesive 334. In the non-limiting example shown in FIG. 7D, bottom portion or component 126 may be coupled directly to adhesive 334 to couple housing 102 to flex layer 332. Where adhesive 334 is formed as a pressure sensitive adhesive, bottom portion or component 126 may be pressed into adhesive 334 to form the bond and/or to adhere housing 102 to flex layer 332. By adhering housing 102 to flex layer 332 using adhesive 334, a hermetic seal may be formed within electronic device 100 between cover 112, housing 102 and the various layers and components of capacitive sensor assembly 324. The adhering of the bottom portion or component 126 of housing 102 to flex layer 332 using adhesive 334 shown in FIG. 7D may correspond to operation 410 in FIG. 6.

Figure 8:
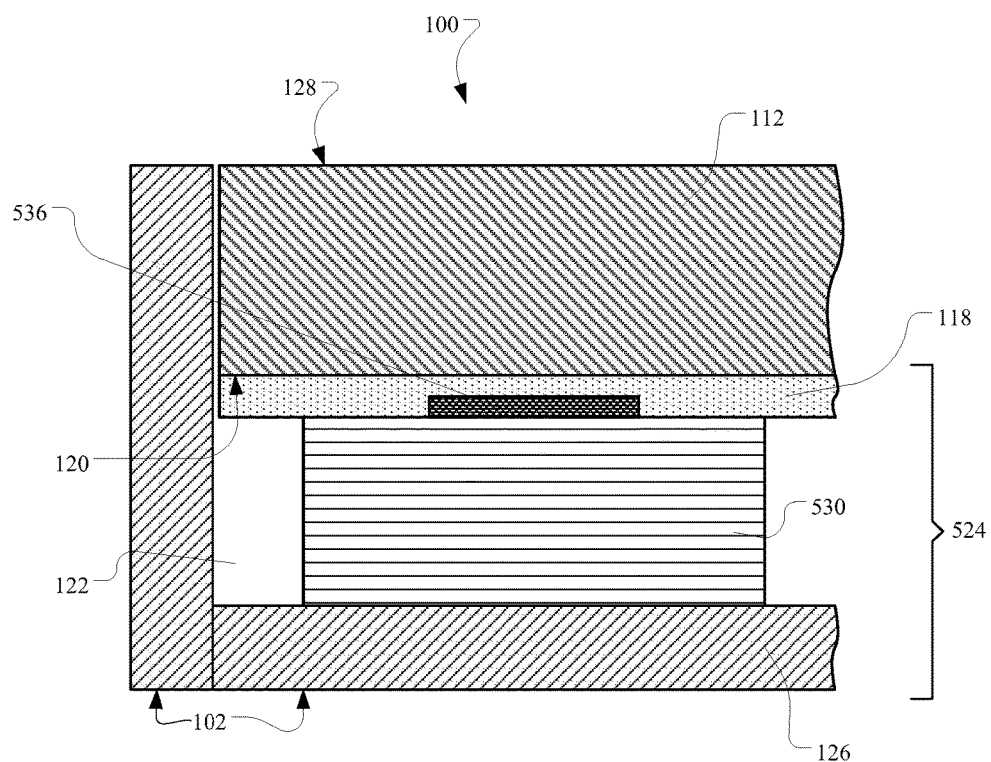
FIG. 8 depicts an illustrative cross-section side view of a portion of the electronic device of FIG. 1 including a capacitive sensor assembly, taken along line CS-CS, according to further embodiments.

FIG. 8 depicts an enlarged cross-section front view of a portion of electronic device 100 of FIG. 1 taken along line CS-CS, according to a further embodiment. Electronic device 100 shown in FIG. 8 includes a capacitive sensor assembly 524 having a distinct configuration from capacitive sensor assembly 124, 324 discussed herein with respect to FIGS. 2-4D, and 5-7D, respectively. It is understood that similarly numbered and/or named components of electronic device 100 and capacitive sensor assembly 524 may function in a substantially similar fashion. Redundant explanation of these components has been omitted for clarity.

As shown in FIG. 8, and as similarly discussed herein with respect to FIG. 5, an electrical trace of capacitive sensor assembly 524 may formed in intermediate layer 118 formed on inner surface 120 of cover 112. In the non-limiting example shown in FIG. 8, first electrical trace 536 may be formed in intermediate layer 118. Similar to capacitive sensor assembly 124 of FIG. 2, and dissimilar to capacitive sensor assembly 324 of FIG. 5, capacitive sensor assembly 524 may not include a second, distinct electrical trace formed between cover 112 and housing 102. As such, and as similarly discussed herein with respect to FIG. 2, bottom portion or component 126 of housing 102 may be formed from an electrically conductive material and may act as a cooperating electrical trace for first electrical trace 536 positioned within intermediate layer 118. First electrical trace 536 positioned within intermediate layer 118 and bottom portion or component 126 of housing 102 may detect a force applied to cover 112 by measuring a change in capacitance between electrical trace 536 and bottom portion or component 126, as discussed herein with respect to FIG. 2. Redundant explanation of these functions have been omitted for clarity.

Dissimilar to capacitive sensor assembly 124 of FIG. 2 and capacitive sensor assembly 324 of FIG. 5, capacitive sensor assembly 524 of FIG. 8 may not include a flex layer (e.g., flex layer 132—FIG. 2; flex layer 332—FIG. 5). In the non-limiting example where first electrical trace 536 is positioned within intermediate layer 118 and bottom portion or component 126 act as a cooperating electrical trace for first electrical trace 536, flex layer may be removed from capacitive sensor assembly 524. Additionally, because the flex layer may be removed from capacitive sensor assembly 524, the adhesive layer used to bond the flex layer to intermediate layer 118 (e.g., adhesive 134—FIG. 2) or housing 102 (e.g., adhesive 334—FIG. 5) may also be removed from capacitive sensor assembly 524. The removal of the flex layer and the adhesive layer may reduce the number of layers and the height of capacitive sensor assembly 524. Additionally, the removal of the flex layer and the adhesive layer from capacitive sensor assembly 524 may reduce the overall size and/or height of electronic device 100 as well.

Silicone layer 530 may be coupled to intermediate layer 118 and housing 102. In a non-limiting example shown in FIG. 8, and distinct from silicone layers 130, 330 in FIGS. 2 and 5, respectively, silicone layer 530 may be coupled, bonded and/or cured to intermediate layer 118 formed on inner surface 120 of cover 112, and bottom portion or component 126 of housing 102. As such, silicone layer 530 may be the only compliant layer formed between first electrical trace 536 and bottom portion or component 126, as the flex layer and the adhesive layer have been removed from capacitive sensor assembly 524.

Figure 9:
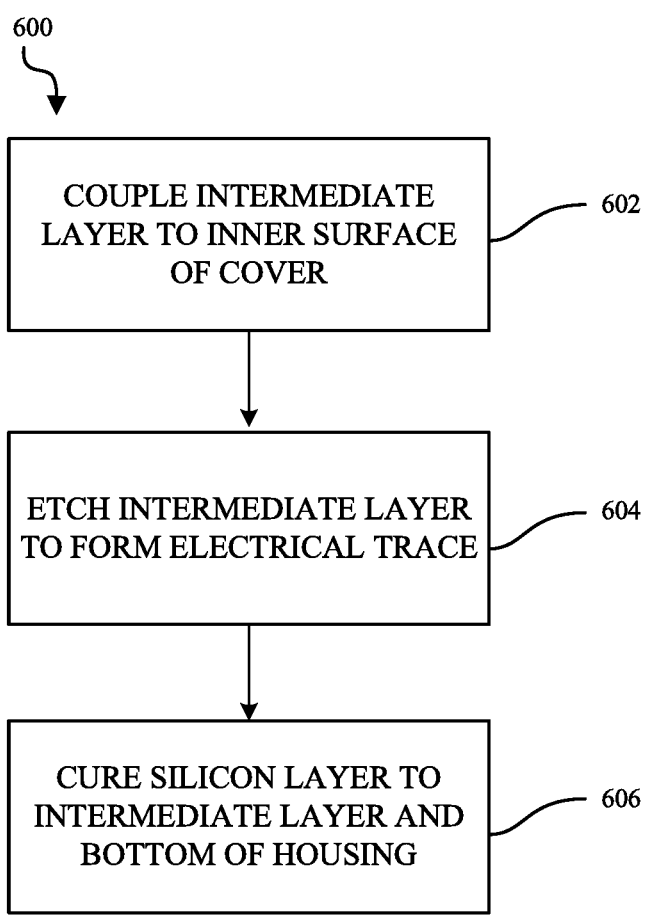
FIG. 9 depicts a flow chart of an additional example process for forming a capacitive sensor assembly for an electronic device, according to further embodiments.

FIG. 9 depicts an example process for forming a capacitive sensor assembly for an electronic device. Specifically, FIG. 9 is a flowchart depicting one example process 600 for forming a capacitive sensor assembly having cooperating electrical traces formed from a first electrical trace and an electrically conductive housing. In some cases, process 600 may be used to form one or more capacitive sensor assemblies, as discussed above with respect to FIG. 8.

In operation 602, an intermediate layer may be coupled to an inner surface of a cover for an electronic device. In operation 604, a portion of the intermediate layer may be etched to form an electrical trace. In operation 606, a silicone layer may be cured to the intermediate layer and a bottom portion or component of a housing for the electronic device.

Figure 10A:
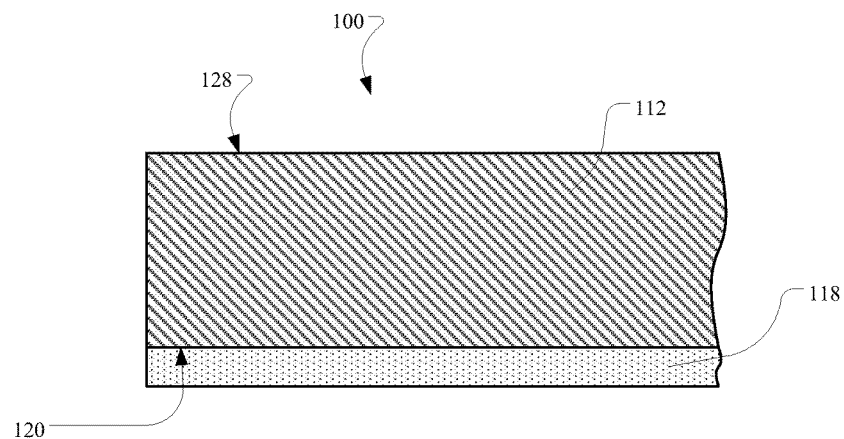
FIGS. 10A-10C depict illustrative cross-section side views of a portion of the electronic device of FIG. 1 and various components of a capacitive sensor assembly undergoing the process depicted in FIG. 9, according to further embodiments.
Figure 10B:
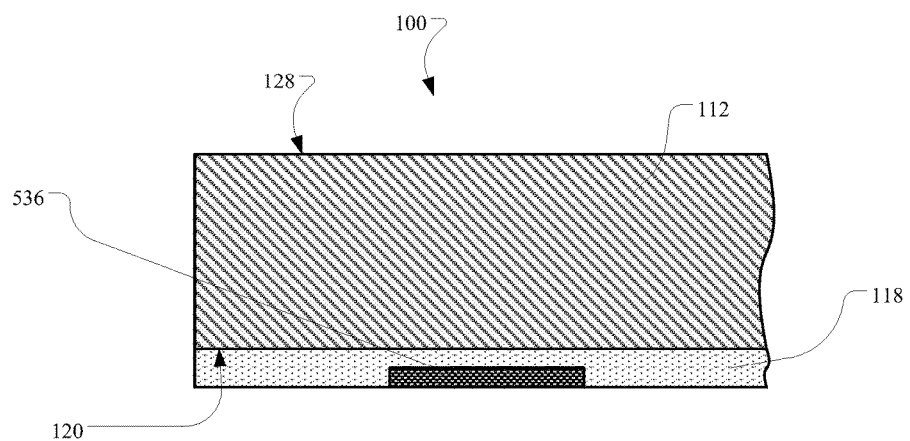
Figure 10C:
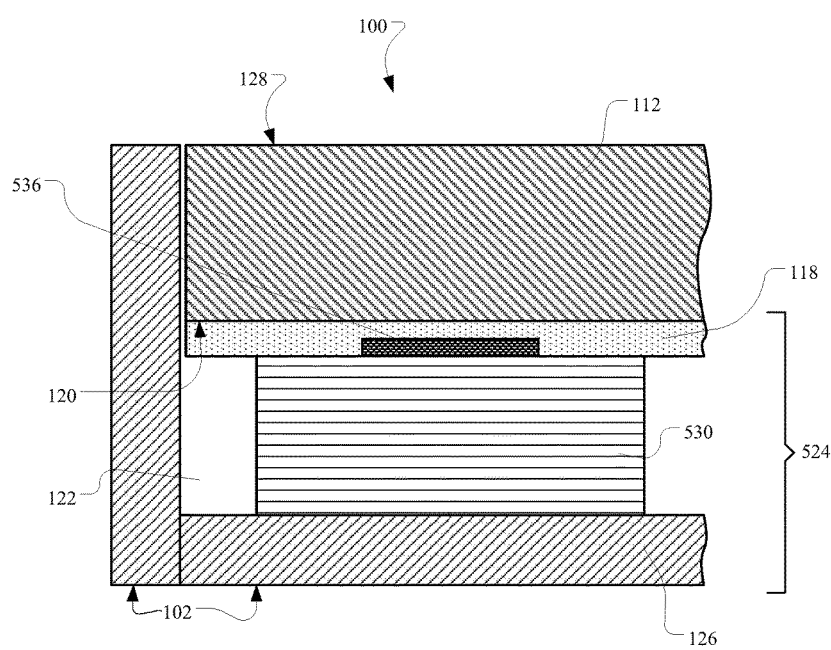

FIGS. 10A-10C show capacitive sensor assembly 524 for electronic device 100 (see, FIG. 10C) undergoing various operations that may be performed in accordance with process 600 of FIG. 9. It is understood that similarly numbered components may function in a substantially similar fashion. Redundant explanation of these components has been omitted for clarity.

As shown in FIG. 10A, intermediate layer 118 may be coupled to inner surface 120 of cover 112. Intermediate layer 118 may be formed from a variety of materials, and as such, may be coupled and/or applied to cover 112 using various techniques. In a non-limiting example, intermediate layer 118 may be formed from an ink material. The ink material may be deposited on inner surface 120 of cover 112 using any suitable deposition technique or process including, but not limited to, painting, spraying, mask-and-ink submersion and the like. In another non-limiting example, intermediate layer 118 may be formed as a substantially solid material layer. In the non-limiting example, the substantially solid material layer may be formed as a plastic layer that may be coupled to inner surface 120 of cover 112. The plastic layer may be coupled to the inner surface 120 using any suitable coupling technique or process (e.g., bonding, welding, melting, and so on). Furthermore, and as discussed in detail with respect to FIG. 7B, intermediate layer 118 may be formed from a thermoplastic material that may be doped with metal-plastic additives. The metal-plastic additives may be activated and/or react when exposed to a laser beam. The coupling of intermediate layer 118 to inner surface 120 of cover 112 shown in FIG. 10A may correspond to operation 602 in FIG. 9.

FIG. 10B shows intermediate layer 118 having undergone an etching process to form first electrical trace 536. Various etching processes may be performed on intermediate layer 118 to form first electrical trace 536. In a non-limiting example, intermediate layer 118 may undergo a laser direct structuring (LDS) process. During the LDS process, a portion of intermediate layer 118, formed from thermoplastic material having doped metal-plastic additives, may be exposed to a laser. The laser may cause the metal-plastic additives to react or activate, which may result in the exposed portions of intermediate layer 118 to change in chemical composition. The intermediate layer 118 may be subsequently dunked in a bath of a metal material (e.g., copper), where the exposed portions of intermediate layer 118 may attract the metal material to form first electrical trace 536. In another non-limiting embodiment, intermediate layer 118 may be masked and subsequently etched to form a trench in a portion of intermediate layer 118. Conductive material (e.g., copper) may then be deposited within the trench formed in intermediate layer 118 to form first electrical trace 536. The etching of intermediate layer 118 to form first electrical trace 536 shown in FIG. 10B may correspond to operation 604 in FIG. 9.

As shown in FIG. 10C, silicone layer 530 may be coupled, bonded or cured to a portion of intermediate layer 118 formed on cover 112 and bottom portion or component 126 of housing 102. Silicone layer 530 may be coupled, bonded or cured to intermediate layer 118 and housing 102 using a variety of bonding techniques. In a non-limiting example, silicone material forming silicone layer 530 may be injection molded between intermediate layer 118 or bottom portion or component 126 of housing 102. In another non-limiting example, silicone layer may be die-cut to shape and subsequently installed or positioned on intermediate layer 118 or bottom portion or component 126 of housing 102. The die-cut silicone layer 130 may be in an uncured state. Subsequent to positioning the die-cut silicone layer 530, cover 112 including intermediate layer 118, bottom portion or component 126 of housing 102 and silicone layer 530 may all undergo a curing process. The coupling, bonding or curing of silicone layer 530 to intermediate layer 118 and bottom portion or component 126 shown in FIG. 10C may correspond to operation 606 in FIG. 9.

Although discussed herein as a bottom portion or component of the external housing of the electronic device, it is understood that bottom portion or component 126 may not be a portion of housing 102, and/or may not be external component of electronic device 100. In another non-limiting example, bottom component 126 may be a bottom component of the capacitive sensor assembly, and may be an internal component or structure positioned within opening 122 formed between cover 112 and housing 102. Additionally, cover may not include an external component of electronic device 100, and/or may not be substantially transparent. Similar to bottom component 126, cover 112 may be a top component of the capacitive sensor assembly, and may be an internal component or structure positioned within opening 122 formed between cover 112 and housing 102.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. An electronic watch, comprising:
a housing having an opening;
a button positioned along a side of the housing to receive user input to the electronic watch;
a cover disposed over the opening and defining an exterior face of the electronic watch;
a display disposed at least partially within the opening and visible through the cover;
an ink layer disposed around a perimeter of an underside of the cover; and
a capacitive sensor assembly positioned within the housing and visually obscured by the ink layer; wherein,
the display comprises a touch sensor;
the capacitive sensor assembly is configured to detect a deflected position of the cover when the exterior face is pressed inward toward the housing; and
the display is responsive to user input received via the button, the touch sensor, or the cover.

2. The electronic watch of claim 1, wherein:
the capacitive sensor assembly comprises an electrical trace; and
the electrical trace is positioned at least partially within the ink layer.

3. The electronic watch of claim 2, wherein:
the capacitive sensor assembly further comprises a deformable component disposed within the housing below the cover; and
the electrical trace is configured to move when the exterior face is pressed inward.

4. The electronic watch of claim 3, wherein:
the housing comprises an electrically conductive region; and
the capacitive sensor assembly is configured to detect a change in capacitance between the electrical trace and the electrically conductive region.

5. The electronic watch of claim 3, wherein the deformable component comprises:
a first portion defined by a flex layer; and
a second portion defined by a silicone layer.

6. The electronic watch of claim 1, wherein the ink layer is disposed around an interactive area of the display.

7. The electronic watch of claim 6, wherein the cover comprises a sapphire material.

8. The electronic watch of claim 1, wherein the display is configured to depict a graphical output of the electronic watch, which graphical output changes in response to the deflected positioned of the cover.

9. The electronic watch of claim 1, wherein the capacitive sensor assembly is in electrical communication with the display.

10. An electronic watch, comprising:
a housing defining a watch body;
a button along a side of the housing;
a first sensor in electrical communication with internal components of the electronic watch and configured to detect a first input received at the button;
a transparent cover disposed at least partially within the housing and configured to receive a second input;
an opaque layer disposed on a surface of the transparent cover within the housing; and
a second sensor at least partially obscured by the opaque layer and having electrical components that move toward one another in response to the second input.

11. The electronic watch of claim 10, wherein:
the electronic watch further comprises a touch-sensitive display; and
the transparent cover forms an exterior surface of the touch-sensitive display.

12. The electronic watch of claim 11, wherein:
the touch-sensitive display is configured to depict a graphical output of the electronic watch; and
the graphical output is configured to change:
in a first manner in response to the first input; and
in a second manner in response to the second input.

13. The electronic watch of claim 10, wherein the first sensor comprises a tactile switch.

14. The electronic watch of claim 10, wherein the second sensor comprises a capacitive sensor assembly comprising a deformable component.

15. The electronic watch of claim 14, wherein the deformable component separates a first of the electrical components and a second of the electrical components within the housing.

16. The electronic watch of claim 10, wherein:
one of the electrical components is within the opaque layer, a deformable component, or an adhesive layer.

17. An electronic watch, comprising:
a housing having:
an internal volume; and
an opening along an exterior surface and extending into the internal volume;
a cover positioned over the opening;
an ink layer defining an opaque region about a perimeter of the cover;
a first electrical trace positioned along the ink layer and within the internal volume;
a deformable component within the internal volume; and
a second electrical trace connected to the deformable component and capacitively coupled to the first electrical trace, wherein
the deformable component is configured to compress in response to a press input received at the cover, thereby moving the first electrical trace and the second electrical trace toward one another within the internal volume.

18. The electronic watch of claim 17, wherein the first electrical trace is positioned at least partially within the ink layer.

19. The electronic watch of claim 17, further comprising a processing unit positioned within the housing and configured to control a function of the electronic watch in response to the movement of the first electrical trace and the second electrical trace within the internal volume.

20. The electronic watch of claim 17, further comprising:
a display positioned below the cover, within the housing;
wherein the display is configured to depict a graphical output of the electronic watch, which graphical output changes in response to a deflected positioned of the cover.

* * * * *